United States Patent [19]

Kusuhara

[11] Patent Number: 4,736,758
[45] Date of Patent: Apr. 12, 1988

[54] VAPOR DRYING APPARATUS

[75] Inventor: Masaki Kusuhara, Tokyo, Japan

[73] Assignee: Wacom Co., Ltd., Tokyo, Japan

[21] Appl. No.: 821,545

[22] Filed: Jan. 21, 1986

[30] Foreign Application Priority Data

| Apr. 15, 1985 | [JP] | Japan | 60-78397 |
| Apr. 15, 1985 | [JP] | Japan | 60-78399 |
| May 30, 1985 | [JP] | Japan | 60-115475 |
| May 30, 1985 | [JP] | Japan | 60-115476 |
| Jul. 17, 1985 | [JP] | Japan | 60-156012 |
| Jul. 17, 1985 | [JP] | Japan | 60-156014 |
| Jul. 17, 1985 | [JP] | Japan | 60-156015 |

[51] Int. Cl.$^4$ ............ B08B 7/04; B08B 15/02
[52] U.S. Cl. ............ 134/66; 134/76; 134/82; 134/105; 134/114
[58] Field of Search ........ 134/61, 66, 76, 82, 134/92, 105, 106, 114, 107; 68/5 E; 34/242

[56] References Cited

U.S. PATENT DOCUMENTS

| 2,248,662 | 7/1941 | Edhofer et al. | 134/114 X |
| 2,352,709 | 7/1944 | Haase | 134/114 X |
| 2,689,198 | 9/1954 | Judd | 134/114 X |
| 2,896,640 | 7/1959 | Randall et al. | 134/105 X |
| 4,236,392 | 12/1980 | Sando et al. | 68/5 E |

Primary Examiner—Philip R. Coe
Attorney, Agent, or Firm—Kinney & Lange

[57] ABSTRACT

A vapor drying apparatus for semiconductor wafers, which is capable of preventing dust particles from entering the interior of the vapor drying apparatus incorporating therein a water washing part and a vapor drying part for a semiconductor wafer and, at the same time, thoroughly removing from the surface of a vapor dried semiconductor wafer the vapor cleaner adhering in the form of film or in a molecular thickness to the surface of an organic substance contained in the cleaner thereby bring the surface of the semiconductor wafer to an ideally cleaned and dried state.

23 Claims, 8 Drawing Sheets

VAPOR DRYING APPARATUS

BACKGROUND OF THE INVENTION

1. Field of the Invention

This invention relates to an apparatus for vapor drying of objects, and more particularly to a vapor drying apparatus for semiconductor wafers.

To be more specific, this invention relates to a vapor drying apparatus for semiconductor wafers, which is capable of preventing dust particles from entering the interior of the vapor drying apparatus incorporating therein a semiconductor wafer cleaning part and, at the same time, thoroughly removing from the surface of a vapor dried semiconductor wafer the vapor cleaner adhering in the form of film or in a molecular thickness to the surface or an organic substance contained in the cleaner thereby bringing the surface of the semiconductor wafer to an ideally cleaned and dried state.

2. Description of the Prior Art

It has been generally held that the process for manufacture of semiconductor wafers such as of silicon (hereinafter referred to simply as "wafers") necessitates incorporation of a step of cleaning subsequently to the step of chemical treatment of wafers. In this step of cleaning, it is necessary for the vapor drying apparatus first to admit a carrier supporting thereon a chemically treated wafer through a wafer insertion door thereof. Heretofore, the opening and closing of this door and the insertion of the aforementioned carrier have been manually carried out.

Then, the wafer-supporting carrier so inserted in the interior of the vapor drying apparatus is lifted by an automatically controlled movable hanger and immersed in deionized water (hereinafter referred to as "DI water") for cleaning of the wafer. Thereafter, the wafer as supported on the carrier is transported by the movable hanger into a vapor cleaning tank.

This vapor cleaning tank is a quartz container holding therein a prescribed amount of a volatile cleaning liquid [such as, for example, isopropyl alcohol (hereinafter referred to as "IPA")]. The aforementioned IPA is warmed with the heat from a heater disposed below and is kept in a vaporized form within the quartz container.

When the aforementioned wafer is brought into the vapor of IPA, the IPA vapor is cooled and liquefied by the wafer wet with the aforementioned DI water and allowed to trickle down the wafer surface. In the meantime, the moisture adhering to the wafer is displaced with IPA, with the result that this moisture is removed from the wafer surface. In this while, the wafer is gradually heated by the IPA vapor. The liquefaction of IPA ceases to occur when the temperature of the wafer is equalized with that of the IPA vapor.

As the result, the foreign particles which adhere to the wafer during the cleaning with the aforementioned DI water and/or the subsequent step are thoroughly washed out and the wafer surface is brought to a clean, dry state. Subsequently, the cleaned and dried wafer as supported on the carrier is transferred by the movable hanger to a wafer removing part.

As is well known, the space inside the vapor drying apparatus is required to be kept in a clean state lest foreign particles should adhere to the wafer. By this reason, the operator assigned to the job of inserting the wafer-supporting carrier into the vapor drying apparatus has been required to observe the rule of wearing a dustproof work dress and dustproof gloves, for example, while engaging in the operations of opening and closing the wafer insertion door and inserting the carrier through the door into the vapor drying apparatus.

The wafer surface which has undergone the vapor drying treatment assumes a dry state as described above. Microscopically, however, the IPA generally remains in the form of film or in a molecular thickness on the wafer surface. The wafer surface is eventually dried completely because the IPA remaining in the state just mentioned is spontaneously diffused into the ambient air with elapse of time.

The conventional technique described above has had the following disadvantages:

(1) The operator, while transferring the wafer-supporting carrier into and out of the vapor drying apparatus, wears the dustproof dress and other gear in an effort to prevent foreign particles from entering the apparatus. In accordance with the conventional technique, since the aforementioned carrier is directly brought into or taken out of the apparatus manually, there inevitably ensues entry of inorganic and/or organic particles into the apparatus.

(2) On the wafer surface which has undergone the vapor drying treatment, the IPA yet to be spontaneously diffused remains in the form of film or in a molecular thickness as described above. As the result, the wafer fresh out of the vapor drying treatment cannot be immediately subjected to the treatment of the subsequent step. In the conventional operation, therefore, between the time the vapor drying treatment performed on the wafer is completed and the time the subsequent treatment is started, the wafer is required to stand idle until the IPA completes its spontaneous diffusion. Thus, the operations suffers from poor efficiency.

(3) There is the possibility that even after the IPA adhering to the wafer surface fresh out of the vapor drying treatment vanishes as through spontaneous diffusion, organic substances such as carbon will remain fast on the aforementioned wafer surface. It is difficult to bring the wafer surface to a thoroughly cleaned state.

SUMMARY OF THE INVENTION

This invention has been produced for the purpose of solving the problems described above.

A primary object of this invention is to provide a vapor drying apparatus which enables the work of entry of the wafer-supporting carrier into the vapor drying apparatus to be carried out without human attention and, as the result, prevents foreign particles from entering the apparatus.

Another object of this invention is to provide a vapor drying apparatus which has the part for insertion of the wafer into the vapor drying apparatus and/or the part for discharge of the wafer therefrom formed of what is called pass-through room.

Yet another object of this invention is to provide a vapor drying apparatus which is furnished with means for promoting the drying of the wafer inside the apparatus.

Still another object of this invention is to provide a vapor drying apparatus which is furnished with means for preventing the density of IPA vapor from rising excessively inside the apparatus.

A further object of this invention is to provide a vapor drying apparatus which is furnished with means for quickly lowering the temperature of IPA in an emergency of the apparatus and preventing the IPA from vaporization.

The first characteristic of this invention resides in the fact that the part for the insertion of a wafer into the vapor drying apparatus and/or the part for the discharge of the wafer therefrom are each formed of a pass-through room which possesses a space perfectly independent of the space inside the aforementioned vapor drying apparatus and, when necessary, assumes a state capable of communicating with the space in the aforementioned vapor drying apparatus.

The second characteristic of this invention resides in the fact that the vapor drying apparatus is so constructed that between the time the vapor drying treatment on the semiconductor wafer is completed and the time the wafer is discharged out of the apparatus, the wafer may be heated by irradiation with infrared ray and the vapor cleaning liquid remaining in a minute amount on the wafer surface may be consequently removed early and completely.

The third characteristic of this invention resides in the fact that the vapor drying apparatus is furnished with means for decomposing and removing the organic substance adhering to the surface of the wafer which has undergone the vapor drying treatment and has been brought into the aforementioned pass-through room.

The other objects and characteristics of the present invention than those mentioned above will become apparent from the description to be given in detail below with reference to the accompanying drawings.

DETAILED DESCRIPTION OF PREFERRED EMBODIMENTS

Figure 1:
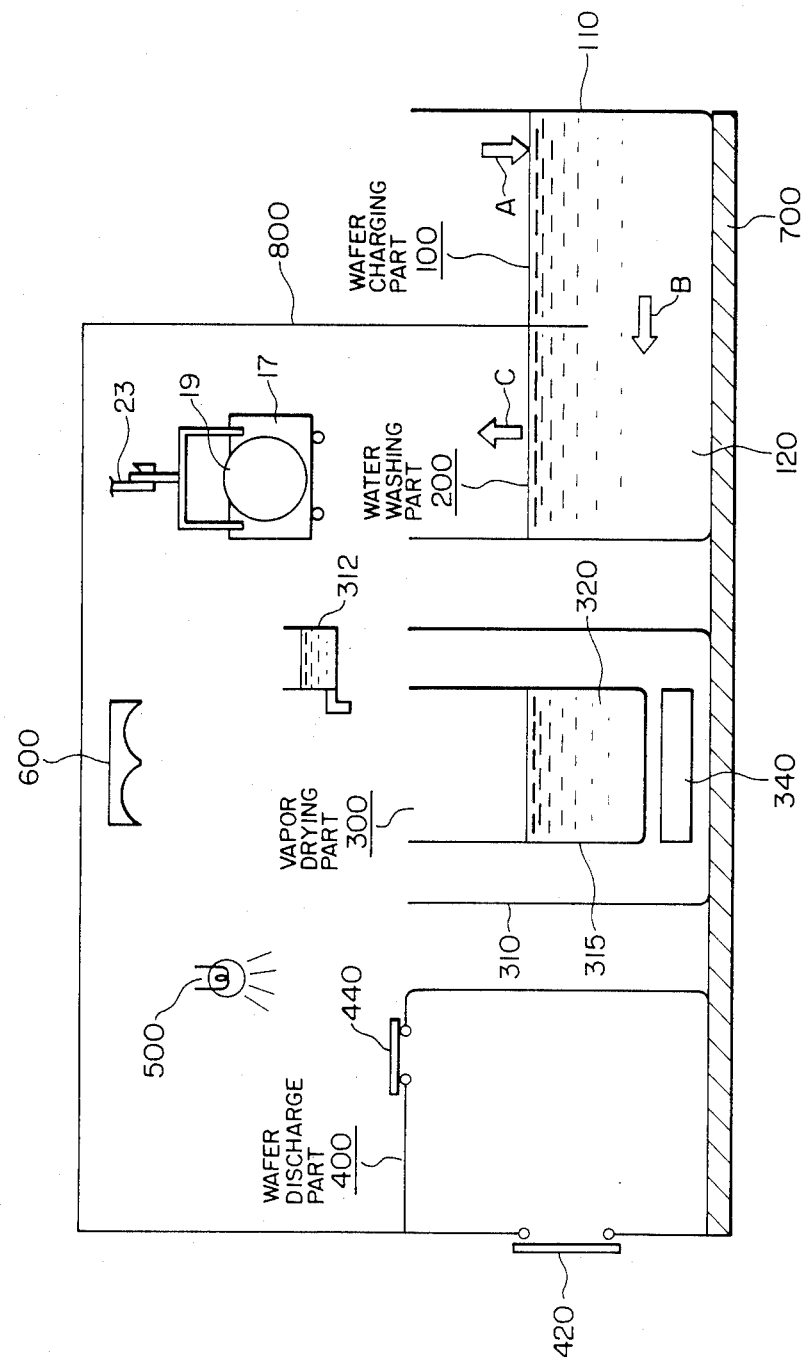
FIG. 1 is a system diagram schematically illustrating the construction of a typical vapor drying apparatus embodying the present invention.

FIG. 1 is a system diagram schematically illustrating the construction of a typical vapor drying apparatus embodying the present invention. The detailed constructions of the components of the vapor drying apparatus will be described afterward. Here, the construction of the invention and the operation of vapor drying will be outlined.

On a base 700, a wafer charging part or section 100, a water washing part or section 200, and a vapor drying part or section 300 are disposed in the order mentioned. They are isolated from ambient conditions by a partition member 800. The aforementioned wafer charging part 100 and water washing part 200 are formed in one common DI water container 110, in which a suitable amouht of DI water 120 is stored. One end (righthand end in the diagram) of the aforementioned partition member 800 is substantially vertical and extends down into the DI water to divide the DI water container into the wafer charging part 100 and the water washing part 200.

The vapor drying part 300 incorporates a cleaning tank 310. On the bottom of the cleaning tank 310 is disposed heating means 340. On the heating means 340 is mounted a quartz container 315 holding therein IPA 320. When the IPA 320 is heated by the heating means 340, the vapor of the IPA 320 fills up the upper space of the quartz container 315. Above the IPA container 315 is disposed a water tank 312 storing therein the water to be used for cooling the IPA 320 or/and the heating means 340 in emergency such as overheating of IPA.

Behind the vapor drying part 300, a pass-through room 400 for discharge of a dried wafer is disposed as laid through the partition member 800. The pass-through room 400 is intended to permit removal of the wafer out of the vapor drying apparatus without establishing direct communication between the interior of the vapor drying apparatus and the exterior of partion member 800. It is provided with an outer door 420 and an inner door 440.

Above the vapor drying part 300, there is disposed an IPA gas collector 600 adapted to collect the IPA gas floating in the space inside the partition member 800. An infrared heater 500 is disposed at a suitable position along the path for wafer transfer between the vapor drying part 300 and the pass-through room 400.

Wafers 19 are mounted on or stowed in a carrier 17 at the wafer charging part 100 as illustrated in FIG. 1 and dipped in the DI water 120 held in the DI water container 110 as indicated by the arrow A and transferred through an opening remaining between the partition member 800 and the bottom of the DI water container 110 into the interior of the partition member 800 as indicated by the arrow B.

In the water washing part 200, after the washing with DI water is completed, wafers supported on the carrier 17 are lifted from the DI water 120 by a movable hanger 23 as indicated by the arrow C. Subsequently, the wafers 19 are transferred into the washing tank 310, there to be cleaned with IPA vapor. Thereafter, the wafers 19 set on the carrier 17 are transferred through the inner door 440 into the aforementioned pass-through room 400, taken out of the partition member 800 through the outer door 420, and forwarded to the subsequent step of treatment.

In the apparatus of FIG. 1, during the insertion of the wafers 19 into the vapor drying apparatus and the discharge of the wafer therefrom, the entry of foreign particles from outside into the interior of the vapor drying apparatus, i.e. the closed space enclosed with the partition member 800, is substantially completely prevented because the wafers 19 are brought into the vapor drying apparatus through the DI water and then taken out through the pass-through room 400.

Now, the construction of each of the components of the vapor drying apparatus of the present invention will be described in detail below.

Figure 2:
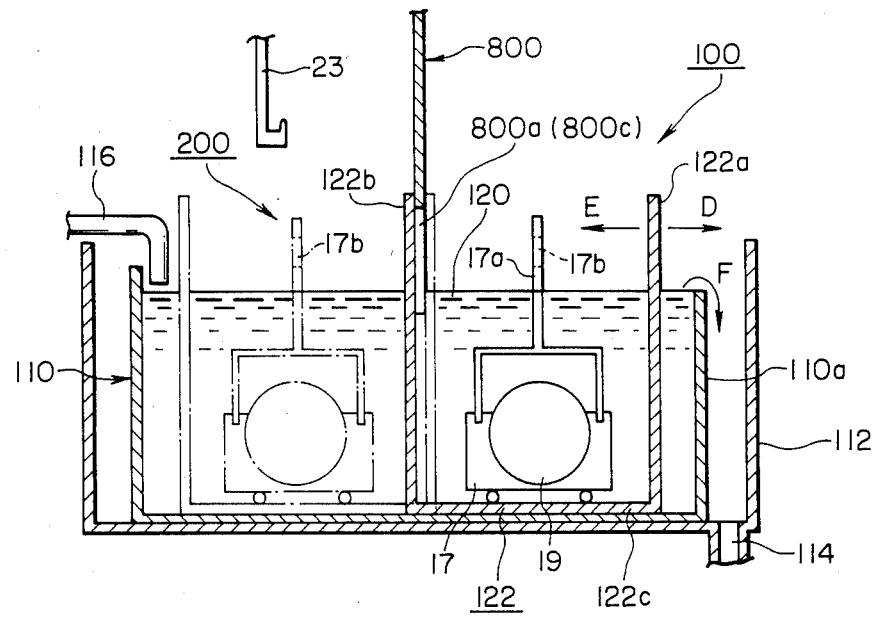
FIG. 2 is a cross section of the part of the vapor drying apparatus for entry of a wafer-supporting carrier into the interior of the vapor drying apparatus.
Figure 3:
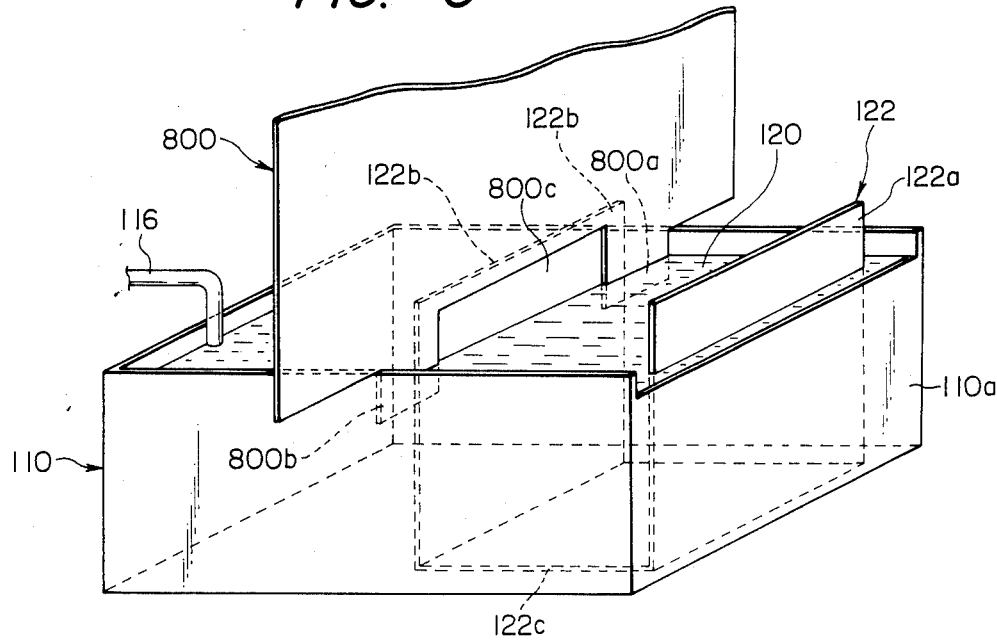
FIG. 3 is a perspective view of the essential part of FIG. 2.

FIG. 2 is a partial cross section illustrating the construction of a typical combination of the wafer charging part 100 and the water washing part 200 embodying the present invention. FIG. 3 is a perspective view of the essential part of the present embodiment of FIG. 2 minus an overflow tank 112.

As illustrated in these diagrams, the container 110 is filled with the DI water 120. This DI water 120 is kept circulated by suitable known means. In the illustrated embodiment, the DI water which overflows the upper edge of a righthand panel 110a of the container 110 as indicated by the arrow F enters a overflow tank 112 and is temporarily discharged via a discharge pipe 114. Then, the DI water is cleaned by filtration and returned via a water feed pipe 116 to the container 110.

At the center of the container 110, the lower edge of the partition panel 800 is located. In the present embodiment, the partition panel 800 forms a boundary wall on the right side on the water washing part 200 situated inside the vapor drying apparatus and on the left side on the wafer charging part 100 situated outside the aforementioned apparatus. FIG. 1 omits illustrating the overflow tank 112 shown in FIG. 2.

The partition panel 800 has lower extended parts 800a and 800b thereof (FIG. 3) immersed in the DI water 120. The lower central part of the partition panel 800 intervening between the lower extended parts 800a and 800b constitutes an indentation 800c intended to permit passage therethrough of an arm part 17a of the carrier 17.

Inside the container 110, namely under the DI water 120, a transfer base 122 having a cross section of the shape of three sides of a rectangle is disposed as illustrated in FIG. 2 and FIG. 3. Specifically, the transfer base 122 consisting of an outer panel 122a, an inner panel 122b, and a bottom panel 122c interconnecting the former two panels is so disposed under the DI water 120 that the bottom panel 122c will remain in contact with the bottom surface of the container 110. The aforementioned partition panel 800 is interposed between the outer panel 122a and the inner panel 122b.

In the present embodiment, the dimensions of the transfer base 122 are selected so that the carrier 17 with the wafers 19 supported thereon may be set on the bottom panel 122c as illustrated in FIG. 2. Further, the relative dimensions of the container 110 and the transfer base 122 are selected so that the inner surface of the inner panel 122b will engage and be stopped against the inner surface of the partition panel 800 when the aforementioned transfer base 122 is moved farthest to the right (indicated by the arrow D), and the inner surface of the outer panel 122a will engage and be stopped against the outer surface of the partition panel 800 when the transfer base 122 is moved farthest to the left (indicated by the arrow E).

Further in the present embodiment, when the transfer base 122 is moved to its stopped position in the direction of the arrow D or the arrow E to stop the inner panel 122b or the outer panel 122a against the partition panel 800, the indentation 800c in the partition panel 800 above the level of DI water is completely closed by the aforementioned inner panel 122b or outer panel 122a. As the result, the atmosphere inside the vapor drying apparatus is completely isolated from exterior ambient conditions with the transfer base in either of its stopped positions.

Now, the operation of the present embodiment will be described.

First, the operator takes hold of the upper part of the outer panel 122a of the transfer base 122 in his hands and draws out the transfer base 122 to its stopped position in the direction of the arrow D. In other words, the transfer base 122 is set in place in the condition shown in solid lines in FIG. 2 and FIG. 3. At this time, the atmosphere inside the vapor drying apparatus is isolated from ambient conditions as described above.

Subsequently, the operator lowers the carrier 17 and the wafers 19 supported thereon into the DI water 120 and sets it on the bottom panel 122c of the transfer base 122. The condition of the carrier 17 supporting thereon the wafers 19 and set in place on the transfer base 122 is indicated by the solid line in FIG. 2. While the carrier 17 is in this position, the upper part of the arm part 17a of the aforementioned carrier 17 protrudes from the surface of the DI water 120.

Then, the transfer base 122 is moved by the operator in the direction of the arrow E until the outer panel 122a is stopped against the partition panel 800. The position of in the transfer base 122 after this movement is indicated by dotted line in FIG. 2. At this time, similarly to the time the aforementioned condition was assumed, the atmosphere inside the vapor drying apparatus is again completely isolated from ambient conditions with the transfer base 122 in its dotted line position.

During the aforementioned movement, the upper part of the arm part 17a of the carrier 17 may pass through the recess 800c in the partition panel 800. Thus, the carrier 17 and the supported wafers 19 are inserted into the interior of the vapor drying device while the carrier is kept resting on the transfer base 122 and immersed in the water. Then, for a prescribed duration, the carrier 17 and the wafers 19 it is supporting are left standing as immersed in the DI water 120. As the result, the wafers 19 have their surfaces washed with the DI water 120 which is kept circulated in a known manner.

When the cleaning with the DI water 120 is completed, the carrier 17 and the wafers 19 supported thereon are lifted by the movable hanger 23 which is fastened to a hole 17b of the arm part 17a. The carrier and the supported wafers are then forwarded to the subsequent step, i.e. into the vapor drying part 300 (FIG. 1).

Incidentally, in the embodiment described above, the atmosphere inside the vapor drying apparatus is allowed to communicate with the ambient conditions through the recess 800c in the partition panel 800 while the aforementioned transfer base 122 is moved in the direction of the arrow E to convey the carrier 17 and the supported wafers 19 into the interior of the aforementioned apparatus.

This situation implies the possibility that the interior of the apparatus will be invaded by foreign particles from the ambient air. Since the vapor drying apparatus is generally installed inside a clean room, the atmosphere or the aforementioned ambient air surrounding the partition member 800 is relatively clean and only a small number of particles are present.

Further in the present invention, optionally nitrogen gas ($N_2$ gas) is constantly injected into the vapor drying apparatus for the purpose of keeping the interior of the partition panel 800 in a cleaner state. As the result, the interior of the vapor drying apparatus remains in the state of positive pressure relative to the atmospheric pressure outside the apparatus. Even when the atmosphere inside the aforementioned apparatus is allowed to communicate with the ambient air during the insertion into the vapor drying apparatus of the carrier 17, the possibility of foreign particles forcing their way into the interior of the apparatus is practically absent.

In the foregoing embodiment, the carrier 17 supporting thereon the wafers 19 has been described as transported into the vapor drying apparatus by means of the transfer base 122 which has a cross section of the shape of three sides of a rectangle but other shapes may be used. This invention does not depend on the particular cross section of the base. For example, the transfer base 122 may be formed in a cross section of the shape of letter L by omitting the inner panel 122b from the construction described above.

When the transfer base to be used has an L-shaped cross section, the single panel 122a is used to close the recess 800c in the partition panel 800 and isolate the atmosphere inside the vapor drying apparatus from the ambient air except when the carrier 17 and the wafers 19 are to be inserted into the interior of the apparatus. When the carrier 17 and the wafers 19 are to be inserted into the interior of the vapor drying apparatus, the transfer base of the L-shaped cross section is pulled out to its solid line position and the aforementioned carrier 17 is set in a prescribed position, so that the subsequent operation of the movement of the transfer base in direction of arrow E into the vapor drying apparatus may be completed as quickly as possible. The panel 122a is left in its position against member 800a until the next wafer loading operation.

The fluidal resistance offered by the DI water to the transfer base during its movement can be decreased by forming at least one perforation, for example, in the panels 122a or 122b of the aforementioned transfer base immersed in the DI water 120.

Further in the foregoing embodiment, the movement of the transfer base has been described as carried out by the hands of the operator. Alternatively, it may be automated by a suitable known method.

Further in the foregoing embodiment, the isolation of the atmosphere inside the vapor drying apparatus from the ambient air has been described as obtained by causing the end panel of the transfer base to close the recess 800c in the partition panel 800 except when the carrier 17 supporting thereon the wafers 19 passes the portion of the partition panel. For this invention, this particular construction is not an exclusive requirement.

For example, the isolation mentioned above may be attained by a construction in which a movable shutter panel (not shown) adapted to close the recess 800c is disposed on at least either of the right and left side surfaces of the partition panel 800 and is raised only during the passage of the carrier 17 through the partition panel 800 and is kept down to close the recess 800c at all the other times. This vertical movement of the shutter panel may be effected manually or automatically. With an automatic mechanism, the aforementioned shutter panel may be slid up by means of an approach sensor or limit switch when the transfer base 122 is moved in the direction of the arrow E (FIG. 2).

Further for this invention, the incorporation of the indentation 800c in the partition panel 800 is not an indispensable requirement. Alternatively, one portion of the lower end of the partition panel may be adapted so as to be vertically movable. Thus, the aforementioned portion of the lower end of the partition panel 800 may be upwardly moved only during the passage of the carrier 17 and may be kept immersed in the DI water 120 at all the other times. This vertical movement of the partition panel may be effected manually or automatically. With an automatic mechanism, the movement may be attained by means of an approach sensor or limit switch in much the same way as in the case of the aforementioned shutter panel.

As is plain from the foregoing description, the embodiment of FIG. 2 and FIG. 3 enables the insertion of the wafer-supporting carrier into the vapor drying apparatus to be carried out without necessitating insertion of human hands into the apparatus. Thus, it can preclude the entry of foreign particles into the apparatus, a fact which has constituted a hindrance to the aforementioned insertion of the carrier.

Figure 4:
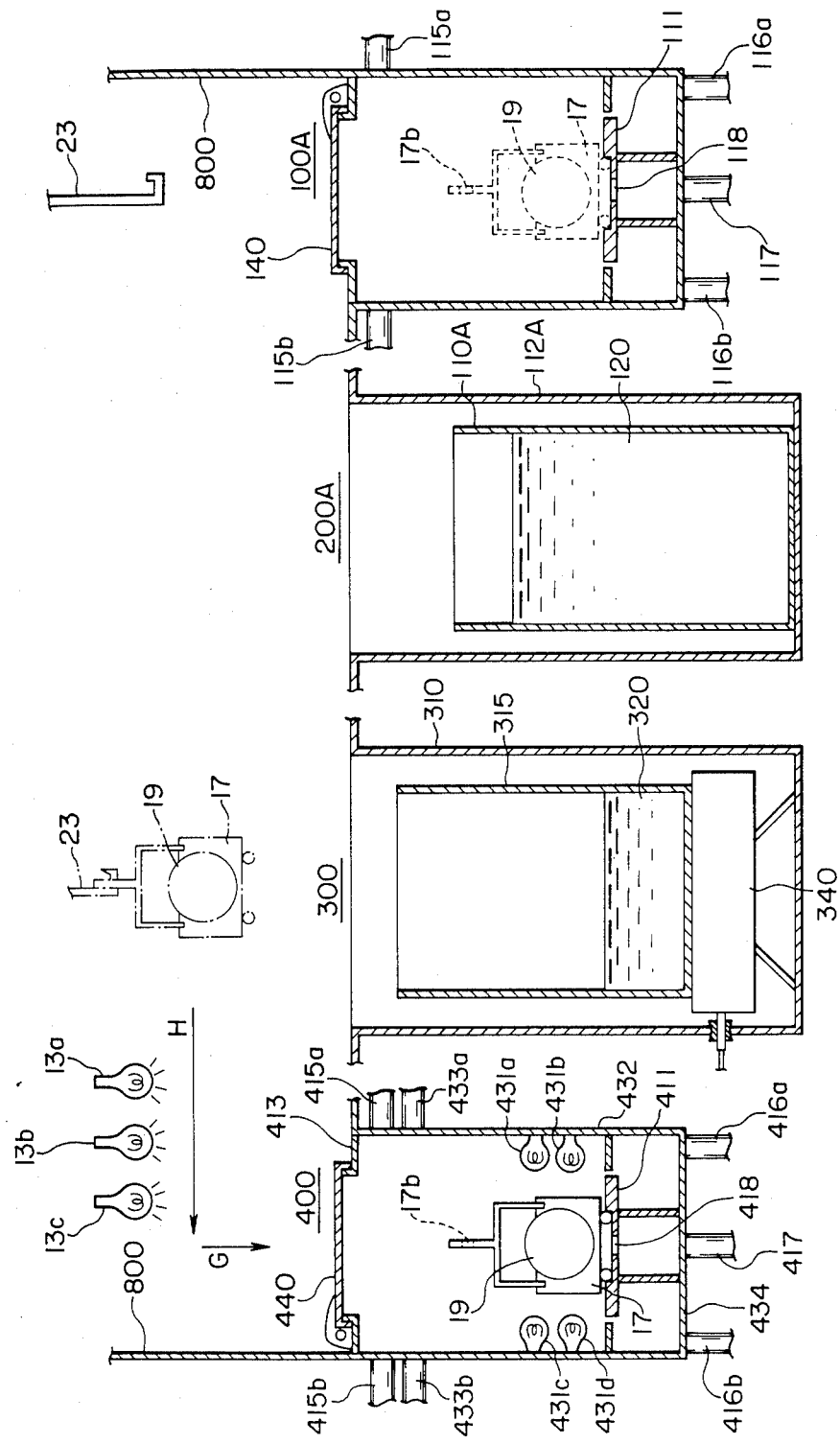
FIG. 4 is a cross section illustrating another typical vapor drying apparatus embodying the present invention. It represents a case of adopting a pass-through room as the part for entry of the wafer and as the room for discharge thereof.

The vapor drying part 300, as illustrated in FIG. 4, incorporates therein the washing tank 310 made of stainless steel. In the bottom portion of the aforementioned washing tank 310, the heating means 340 which is formed of an aluminum block having a heater contained therein in a tightly closed state is disposed. The IPA container 315 made of quartz and containing the IPA 320 is mounted thereon.

Above the quartz container 315, a cooling coil (shown in FIG. 12) adapted to cool and condense the vapor of IPA 320 is disposed, though not shown in FIG. 4 for the sake of simplicity of illustration. Inside the aforementioned washing tank 310, the IPA of a suitable amount in the quartz container is warmed by the heat emanating from the heating means 340 and kept in a vaporized state within the container. When the wafers 19 are brought into the IPA vapor, the wafers wet with the DI water cool and liquefy the IPA vapor and the liquefied IPA trickles down the wafer surface. In the meantime, the moisture adhering to the wafers is displaced with IPA and, consequently, the moisture is removed from the wafers.

The liquefaction of IPA ceases to occur when the wafers are gradually heated by the IPA vapor and the temperature of the wafers are eventually equalized with that of the IPA vapor. In this manner, the particles adhering to the wafers in process of the cleaning with the DI water are washed off completely. Consequently, the wafer surface is brought to a dry state.

FIG. 4 is a cross section illustrating another typical vapor drying apparatus embodying the present invention. The diagram particularly shows the concrete construction of the pass-through room. In this embodiment, another pass-through room is used in the wafer charging part besides the pass-through room used in the wafer discharge part. The water washing part, unlike that of the embodiment of FIG. 1, uses an independent DI water tank 110A and an overflow tank 112A. The vapor drying part 300 used in the present embodiment is identical with that used in the embodiment illustrated in FIG. 1.

Here, the construction of the pass-through room 400 will be described with reference to FIG. 4 and FIG. 5.

In the wafer discharge part or the pass-through room 400, a rail base 411 adapted to hold thereon the wafer-supporting carrier is disposed in the inner lower portion. On the front side in the longitudinal direction of the aforementioned rail base 411, the outer door 420 adapted to be opened and closed manually (FIG. 5 and FIG. 1) is formed.

Above the aforementioned rail base 411 is disposed a ceiling part 413 which is adapted to partition the wafer discharge part or the pass-through room 400 off the atmosphere inside the vapor drying apparatus. The ceiling part 413 is provided therein with the inner door 440 adapted to be automatically opened and closed by known means. In other words, the pass-through room 400 which serves as the wafer discharge part is isolated from the atmosphere inside the vapor drying apparatus by closing the inner door 440.

In the upper portion of the wafer discharge part 400, first gas feed ducts 415a and 415b and second gas feed ducts 433a and 433b for feeding $N_2$ gas (nitrogen gas) and an oxygen-containing gas (such as, for example, air) respectively to the interior of the wafer discharge part 400 are disposed as laid through the partition member 800 and an inner partition wall 432 (FIG. 4).

In the bottom portion of the wafer discharge part 400, there are disposed gas discharge ducts 416a and 416b which are used for discharging the $N_2$ gas fed through the first gas feed ducts 415a and 415b and the air fed through the aforementioned second gas feed ducts 416a and 416b. In a bottom plate 434 of the wafer discharge part 400 which is situated beneath the aforementioned rail base 411, there is disposed a suction duct 417 adapted to absorb and discharge particles possibly produced by the friction generated between the carrier and the rail base 411 when the carrier supporting thereon the wafers is drawn out.

Figure 5:
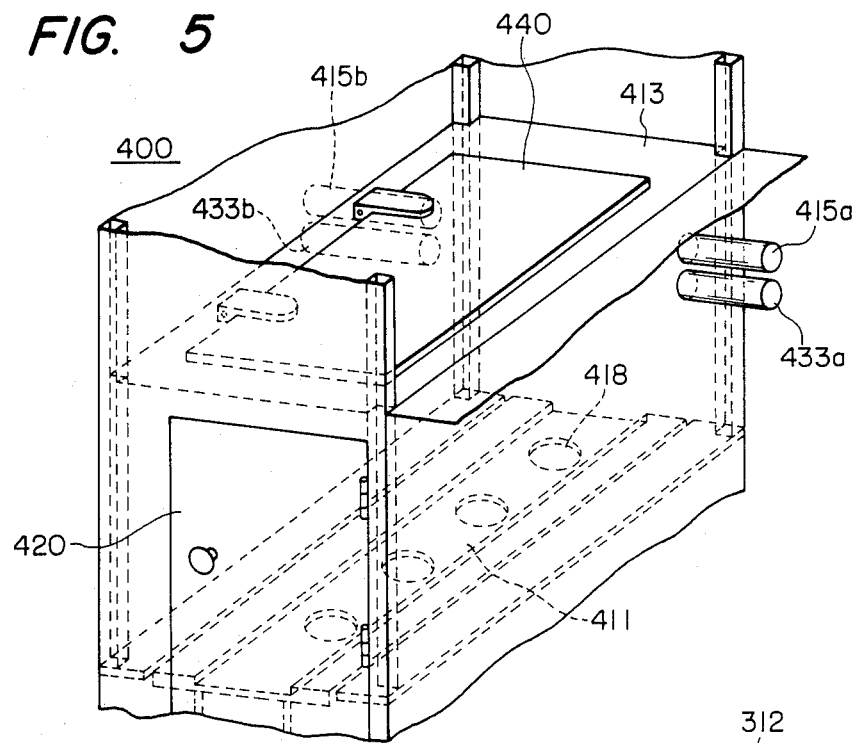
FIG. 5 is a perspective view of the essential part of the pass-through room of FIG. 4.

A plurality of perforations 418 formed in the central portion of the rail base 411 as illustrated in FIG. 5 are intended to guide the particles produced by the friction between the carrier and the rail base 411 to the suction duct.

In the embodiment of FIG. 4, the construction of the wafer charging part or the insertion part 100A is substantially identical with that of the aforementioned wafer discharge part 400, except that the wafer charging part is not provided with the aforementioned second gas feed ducts 433a and 433b. In the following description and the pertinent diagram, the components of the wafer insertion part 100A which possess functions identical or equal to the functions of the components of the wafer discharge part or the pass-through room 400 are denoted by numerical symbols which are sums of 100 and the respective numerical symbols (400+) used in the wafer discharge part 400.

In the vapor drying apparatus constructed as described above, the operator first opens the outer door of the wafer insertion part 100A and sets on the rail base 111 the carrier 17 supporting thereon the wafers 19. Then, the operator moves the aforementioned carrier along the rail base 111 to a prescribed position in the wafer insertion part 100A. The carrier 17 supporting thereon the wafers 19 and brought to the prescribed position on the rail base 111 is illustrated by a dotted line in FIG. 4. Subsequently, the operator closes the outer door (not shown) of the wafer insertion part 100A. During the insertion of the carrier 17 supporting thereon the wafers 19, since the outer door is opened, the atmosphere inside wafer insertion part 100A is allowed to communicate with the ambient air. In the condition assumed then, no direct communication is established between the atmosphere inside the vapor drying apparatus and the ambient air because the inner door 140 is kept closed.

In the present embodiment, clean filtered $N_2$ gas is constantly fed into the wafer insertion part 100A via the gas feed ducts 115a and 115b. As the result, the interior of the wafer insertion part 100A is kept in the state of positive pressure relative to the atmospheric pressure. Even when the outer door is opened for the insertion of the carrier 17, there is virtually no possibility of foreign particles in the ambient air entering the interior of the wafer insertion part 100A.

In the present embodiment, the $N_2$ gas is sucked out of via the suction duct 117 and the perforations 118. When the carrier 17 is moved along the rail base 111, therefore, the particles which are produced by the friction between the carrier 17 and the rail base 111 are discharged as entrained by the aforementioned $N_2$ gas.

When the carrier 17 supporting thereon the wafers 19 is placed in the wafer insertion part 100A, the carrier 17 is left standing in the wafer insertion part 100A for a prescribed duration after the closure of the outer door. This standing is necessary because the foreign particles possibly find their way into the aforementioned wafer insertion part 100A as described above during the manual insertion of the carrier 17 into the wafer insertion part 100A and they are to be discharged by the flow of the aforementioned $N_2$ gas.

The $N_2$ gas fed via the gas feed ducts 115a and 115b is passed through the interior of the wafer insertion part 100A and exhausted and discharged by the aforementioned suction duct 117 and, at the same time, discharged additionally through the gas discharge ducts 116a and 116b. At this time, the aforementioned foreign particles are simultaneously discharged, with the result that the atmosphere inside the wafer insertion part 100A is brought to a clean condition.

On elapse of the aforementioned duration, the inner door 140 is automatically opened by known means. Then, the movable hanger 23 descends into the wafer insertion part 100A and comes into engagement with the hole 17b in the carrier 17. By the movable hanger 23, the aforementioned carrier 17 is transported into the space inside the vapor drying apparatus. Thereafter, the inner door 140 is automatically closed.

The wafers 19 brought out into the space inside the aforementioned vapor drying apparatus is immersed for cleaning in the DI water 120 in conjunction with the carrier 17 by the movable hanger 23. Subsequently, the wafers 19 and the carrier 17 are transported by the movable hanger 23 into the vapor drying part 300. The wafers 19 which have undergone the vapor drying treatment are lifted in conjunction with the carrier 17 by the movable hanger 23 to a position above the vapor drying tank 300 temporarily as indicated by the chain line in FIG. 4. Then, it is transported as indicated by the arrow H to a position above the wafer discharge part or the pass-through room 400. At this time, the inner door 440 of the wafer discharge part 400 is automatically opened by suitable means.

The wafer 19 brought to the position above the aforementioned wafers discharge part 400 are inserted in conjunction with the carrier 17 into the wafer discharge part 400 by the movable hanger 23 as indicated by the arrow G and then set in place on the rail base 411. The state consequently assumed by the wafers 19 is illustrated by the solid line in FIG. 4.

When the carrier 17 supporting thereon the wafers 19 is placed on the rail base 411, the movable hanger 23 slips off the hole 17b, ascends through the inner door 440, and departs from the wafer discharge part 400. Substantially at the same time, the inner door 440 is closed.

In the wafer discharge part or the pass-through room 400, similarly to the wafer insertion part 100A, clean filtered $N_2$ gas is fed in through the gas feed ducts 415a and 415b and discharged through the gas discharge ducts 416a and 416b. As the result, the atmosphere inside the wafer discharge part 400 is kept in a clean state. Even when the inner door 440 is opened for the purpose of introducing the carrier 17 supporting thereon the wafers 19 into the wafer discharge part 400, therefore, there is no possibility of the atmosphere inside the vapor drying apparatus being polluted with foreign particles.

When the carrier 17 supporting thereon the wafers 19 is placed on the rail base 411, it is left standing therein for a prescribed duration. This standing is necessary because the IPA adhering in the form of film or in a molecular thickness on the surfacesof the wafers 19 fresh from the vapor drying treatment must be completely removed by the flow of the $N_2$ gas.

Optionally, the $N_2$ gas fed through the gas feed ducts 415a and 415b may be heated in advance by a heater, for example. By this preheating of the $N_2$ gas, the duration prescribed for the standing of the carrier 17 on the rail base 411 can be shortened. When the wafers, besides being dried with the $N_2$ gas or the preheated $N_2$ gas, are heated by irradiation of the infrared ray issued from at least one infrared lamp disposed at a prescribed position inside and/or outside the wafer discharge part 400, the duration of the standing of the carrier 17 on the rail base 411 required for thorough drying of the wafers 19 can be shortened further.

FIG. 4 illustrates four infrared lamps 431a–431d disposed inside the wafer discharge part 400. When the infrared ray is projected from outside to the wafer discharge part 400, the wall portion of the partition panel 800 to be exposed to the infrared ray is naturally required to be made of a material previous to the infrared ray.

In the foregoing embodiment, the duration required for drying the wafer 19 has been described as shortened further by utilizing the irradiation of the infrared ray in combination with the $N_2$ gas or the preheated $N_2$ gas. Of course, early drying of the wafer 19 may be obtained by solely utilizing the irradiation of the infrared ray. When the drying effected exclusively by the irradiation of the infrared ray is completed, it becomes necessary to feed the $N_2$ gas into the wafer discharge part 400.

When the surface of the wafers 19 is brought to a dry state as described above, the operator opens the outer door 420, takes hold of the carrier 17, pulls the carrier 17 along the rail base 411 toward himself, and removes the wafer 19 as supported on the carrier 17. Thereafter, the outer door 420 is closed.

In the embodiment illustrated in FIG. 4, the interior of the wafer discharge part 400, similarly to that of the wafer insertion part 100A, is kept in the state of positive pressure relative to the atmospheric pressure by the supply of the $N_2$ gas. As the result, the possibility that foreign particles in the ambient air will find their way into the wafer discharge part 400 when the outer door 420 is opened is substantially absent. Since the suction duct 417 continued to exhaust $N_2$ gas through the perforations 418, the particles produced by the friction generated during the removal of of the carrier 17 can be discharged as entrained by the $N_2$ gas.

After the aforementioned carrier 17 is taken out and the outer door 420 closed, therefore, the atmosphere inside the wafer discharge part 400 will shortly assume a thoroughly clean state. When the subsequent carrier 17 supporting thereon new wafers 19 is brought in by the movable hanger 23 in the next round of operation and the inner door is consequently opened, therefore, the atmosphere inside the vapor drying apparatus will not be polluted.

The aforementioned irradiation with the infrared ray for expediting the drying is not required to be carried out exclusively within the pass-through room 400. As described above, the wafers 19 which have undergone the vapor drying treatment in the vapor drying part are lifted in conjunction with the carrier 17 temporarily to the position above the drying part 300. The conditions assumed in consequence of this operation is indicated by the chain line in FIG. 4.

Subsequently, the wafers 19 are transferred in conjunction with the carrier 17 in the directions of the arrow H and the arrow G by the movable hanger 23. FIG. 4 illustrates three infrared lamps 13a–13c arranged inside the vapor drying apparatus in such a manner that the infrared ray will impinge upon the wafers 19 while the carrier 17 supporting thereon the wafers 19 is being moved horizontally in the direction of the arrow H.

Optionally, the infrared lamps for the projection of the infrared ray may be disposed outside the vapor drying apparatus. In this case, it is naturally necessary that at least the portion of the housing of the vapor drying apparatus, i.e. the partition panel 800, which is exposed to the infrared ray should be made of a material transparent to the infrared ray.

By the arrangement described above, the IPA remaining in the form of film or in a molecular thickness on the wafers can be eliminated rapidly and completely. It frequently happens, however, that carbon contained in IPA and other similar organic substances still adhere on the surface of the wafers 19. Now, the means adopted for the removal of such organic substances will be described below.

For the removal of the organic substances adhering to the wafers 19, the supply of $N_2$ gas is discontinued after or during the aforementioned treatment for rapid drying. Then, the supply of a cleaned oxygen-containing gas (hereinafter represented by "air") through the second gas feed ducts 433a and 433b is started. Simultaneously with this supply of air, the irradiation on the wafers 19 with far ultraviolet light is started. To be specific, the wafers 19 are irradiated with the far ultraviolet light issued from at least one low-pressure mercury vapor lamp (not shown) disposed at a prescribed position inside and/or outside the wafer discharge part 400.

In consequence of this irradiation, the atmosphere (air) inside the wafer discharge part 400 is ozonized by the well-known mechanism. By the combined action of the ozone and the far ultraviolet light, such organic substances as carbon adhering to the surface of the wafers 19 are decomposed and diffused into the ambient air. As the result, the organic substances are completely removed from the surface of the wafers 19.

When the aforementioned irradiation of the wafers 19 with the far ultraviolet light is terminated, the operator opens the outer door 420 and takes out the carrier 17 supporting thereon the wafers 19 in the same manner as already described. After the removal of the carrier 17, the operator closes the aforementioned outer door 420. When the outer door 420 is closed, the aforementioned supply of air to the interior of the wafer 400 is stopped and the supply of $N_2$ gas thereto is resumed. As the result, the air in the inside space of the wafer discharge part 400 is displaced with $N_2$ gas and the space is kept in a clean state.

It is, of course, permissible to discontinue the supply of air and resume the supply of $N_2$ gas before the outdoor 420 is opened and the carrier 17 is taken out.

In the foregoing embodiment, the vapor drying apparatus has been described as possessed of the wafer insertion part 100A and the wafer discharge part 400 each using the pass-through room construction of this invention and disposed separately of each other. It is not always necessary to have the wafer insertion part 100A and the wafer discharge part 400 disposed separately of each other. In the embodiment illustrated in FIG. 4, for example, the wafer insertion part 100A may be omitted and the wafer discharge part 400 adapted to fulfil concurrently the function of a wafer insertion part.

In this case, in the condition described above with respect to the wafer insertion part 100A, the carrier 17 supporting thereon the wafers 19 is placed on the rail base 411 in the wafer discharge part 400 and, thereafter, the carrier 17 is transferred into the vapor drying apparatus.

Subsequently, the cleaning treatment in the water washing part 200A and the vapor drying treatment in the vapor drying part 300 are sequentially carried out. Then, the carrier 17 supporting thereon the wafers 19 is returned again to the wafer discharge part 400 and the carrier 17 is taken out as described above.

Evidently, the wafer charging part 100A and the water washing part 200A in the embodiment of FIG. 4 are interchangeable with the wafer charging part 100 and the water washing part 200 in the embodiment of FIG. 1.

As is clear from the foregoing description, the present embodiment brings about the following effects.

(1) No human hands are allowed to enter the interior of the apparatus and, consequently, no foreign particles are suffered to enter and pollute the interior of the apparatus because the wafer-supporting carrier is inserted into and/or taken out of the vapor drying apparatus through the medium of the pass-through room isolated from the space inside the vapor drying apparatus.

(2) The drying treatment can be greatly expedited by feeding the $N_2$ gas or the preheated $N_2$ gas into the pass-through room serving as the wafer discharge part and/or irradiating the wafer inside the pass-through room with the infrared ray thereby rapidly and completely removing the vaporized cleaning liquid adhering in the form of a film or in a molecular thickness to the surface of the wafers. As the result, the time required for the production of semiconductor wafers can be shortened and the efficiency of manufacture can be enhanced.

(3) The removal of the organic substances adhering to the surface of the semiconductor wafer can be effected by feeding the oxygen-containing gas into the pass-through room serving as the wafer discharge part and, at the same time, irradiating the semiconductor wafer in the pass-through room with the far ultraviolet light.

Now, the construction of the vapor drying part beneficial for the present invention will be described in detail below with reference to FIG. 6. In the vapor drying part widely in actual use today, the cleaning liquid such as IPA 320, put in a suitable amount in the quartz container 315 is warmed with the heat generated by the heater built in an aluminum block, specifically the heating means 340, and, therefore, is kept in a vaporized state inside the quartz container 315. The IPA is a liquid which has an ignition point of 310° C., a boiling point of 82.7° C., and a flash point of 21° C.

When the wafers 19 supported on the carrier 17 are brought into the vapor of IPA 320, the moisture adhering to the wafer is removed in the manner described above and the surface of each wafer is brought to a dry state.

The heater used for heating the IPA 320 is kept in a completely closed state in the aluminum block 340. This arrangement is intended to preclude the possibility of the IPA and the vapor thereof fire when the heater is exposed. Further, inside the upper opening of the quartz container 315, a cooling coil (not shown in FIG. 6 but shown in FIG. 12) is disposed in such a manner as to preserve a space for free passage of the wafer-supporting carrier. By the cooling water flowing through the cooling pipe, the vaporized IPA is cooled and liquefied and returned for re-use to the quartz container 315.

Thus, the concentration of the vapor of IPA 320 outside the quartz container, i.e. in the space inside the vapor drying apparatus is not suffered to rise above a prescribed level under the normal condition. To be more specific, the concentration of the vapor of IPA 320 is much lower than the lower explosive limit (hereinafter referred to as "LEL" for short). It is kept lower than 50 to 20% of the LEL. It may be safely concluded, therefore, that in the normal condition, there is no possibility of the vapor drying part catching fire or causing explosion.

In the vapor drying apparatus using such a cleaning liquid as IPA, for example, the possibility that, by some unexpected cause, the concentration of the vapor of IPA 320 may rise higher than 50 to 20% of the LEL and consequently endanger the operation cannot be completely denied. To preclude the danger of this nature, there has been followed the practice of detecting the approach of this danger with a sensor, opening the valve of a carbon dioxide gas cylinder installed in advance thereby diffusing the released carbon dioxide gas within the vapor drying part and suppressing the cause for ignition or explosion of IPA.

In the preventive measure for fire and explosion mentioned above, the sensor does not function normally to induce the diffusion of carbon dioxide gas when the sensor itself is out of order or when the power supply is damaged as by the lightening. Further in the case of the powr failure, the circulation of the cooling water through the cooling pipe is also stopped.

At this time the flow of electric current to the heater is naturally stopped. If the flow of electric current is so discontinued, the heat accumulated theretofore within the aluminum block 340 is much enough for further heating of IPA so long as the thermal capacity of the heater is large. As the result, the IPA 320 continued to be heated and vaporized. During the power failure, therefore, the cooling water held still inside the cooling pipe because of the discontinued circulation continues to be warmed by the vapor of IPA and the condensation of IPA and the return of the IPA condensate are slowly discontinued. In the experiment conducted by the inventors, abnormal upward diffusion of the vapor of IPA outside the quartz container was observed to begin about 140 seconds after stop of power supply.

Figure 6:
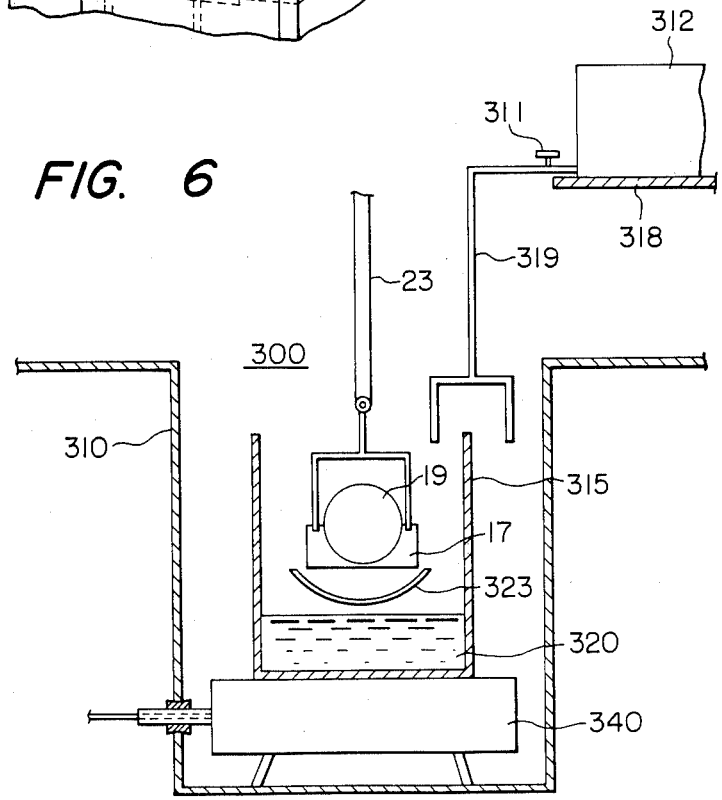
FIG. 6 is a cross section illustrating a typical IPA vapor cleaning device suitable for the present invention.

In view of the foregoing situation, the embodiment of FIG. 6 is specially devised so that when the sensor goes out of order or when the power supply is stopped as by the fall of a thunderbolt, water is poured onto such heating means 340 as aluminum block having a heater water-tightly built therein and/or into the container 315 holding the IPA to cause an abrupt fall of the temperature of the IPA 320 and impede the vaporization of IPA.

For this purpose, a tank 312 storing water therein is installed on a support base 318 in the embodiment of FIG. 6. This tank 312 is provided with a water discharge pipe 319 incorporating a cock 311. When power failure occurs, the operator opens the cock 311 to release the water from the tank 312 and shower on the aluminum box 340 and cause sudden cooling of the aluminum box 340 and, at the same time, shower in the interior of the quartz container 315 and dilute the IPA 320 and impede the vaporization of IPA.

For the purpose of preventing the IPA 320 from vaporization, it suffices to keep the temperature of the IPA 320 below its boiling point 82.7° C. The device of showering both on the aluminum box 340 and in the quartz container 315 as contemplated in the present embodiment is not always necessary. The desire to keep the temperature of IPA 320 below the aforementioned level and curb the vaporization of IPA can be fulfilled by showering either of the two components mentioned above. The simultaneous showering of the two components proves desirable only in the sense that the temperature of IPA 320 can be amply lowered rapidly.

Now, an embodiment in which the DI water primarily used for the purpose of cleaning as described above is diverted as the cooling water during the power failure will be described below with reference to FIG. 7.

Figure 7:
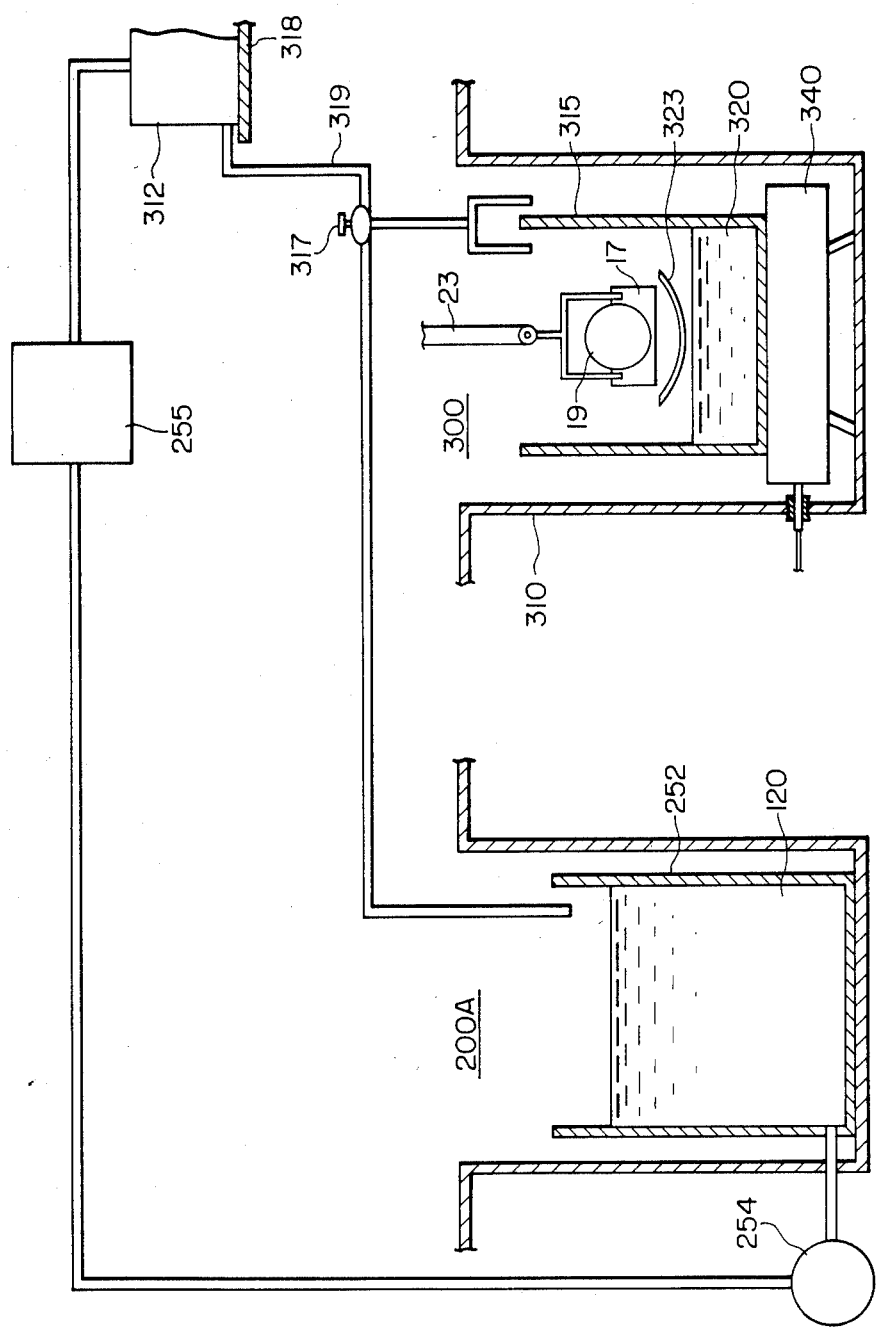
FIG. 7 is a cross section illustrating another typical IPA vapor cleaning device suitable for the present invention.

In FIG. 7, the numerical symbols which have equivalents in FIG. 6 denote either identical or equal parts. In the diagram of FIG. 7, the cooling pipe is omitted from illustration for the sake of simplicity of illustration similarly to FIG. 6 and FIG. 4.

In the embodiment of FIG. 7 a container 252 has the DI water 120 stored therein. A pump 254 lifts the DI water 120 at a fixed rate and returns it through a filter 255 to the tank 312. A three-way cock 317 is intended to permit selection between forwarding the DI water from the tank 312 to the vapor drying part 300 and forwarding it to the container 252 side. This switching is manually effected in the present embodiment.

While the operation of the vapor drying apparatus is normally proceeding, the three-way cock 317 is set so that the DI water stored in the tank 312 will flow through the water discharge tube 319 into the container 252. The pump 54 is adapted to return the DI water through the filter 255 to the tank 312 in substantially the same flow volume as the water flowing into the container 252. As the result, the container 252 constantly remains filled with a substantially fixed amount of the DI water 120 being circulated for the cleaning of the wafers 19.

The wafers 19 which have undergone preliminary cleaning with the DI water so circulated is transferred, as described above, by the movable hanger 23 into the vapor of IPA 320 for drying.

In the present embodiment, when the supply of electric power is stopped as by the fall of a thunderbolt, for example, the supply of the DI water so far conducted to the container 252 can be switched to the interior of the vapor drying part 300 by manually turning the three-way cock 317. In the present embodiment wherein the DI water is diverted as the cooling water to be released during power failure, when the power failure ceases and the normal operation of the apparatus resumes, it suffices only to carry out the step of vapor drying instead of starting the steps of DI water washing and vapor drying all over again from the beginning.

It ought to be easily inferred from the description given above with respect to the embodiment of FIG. 6 that the present embodiment is applicable when the sensor goes out of order.

In the two embodiments described above, the operator is invariably required to take notice of abnormality of the sensor or of the status of power failure, manipulate the cocks 311 and 317, and release plain water or the DI water into the vapor drying part 300. It is naturally permissible to produce these actions automatically by effecting the recognition of the abnormality of the sensor or the status of power failure with suitable means of detection and opening the cocks accordingly or switching the cocks for extending passage to the vapor drying part 300.

The technical ideas underlying the embodiments of FIG. 6 and FIG. 7 pose the following problem.

When water is poured on the heating means 340 tightly incorporating a heater therein, the resulting steam fills up the interior of the vapor drying apparatus. When the apparatus is put to normal use again, the interior of the apparatus must be cleaned to remove the aforementioned steam and the excess moisture deposited on the wall of the container 315. when water is poured into the container 315 filled with IPA, for example, the IPA becomes unserviceable and must be discarded as waste.

Figure 8:
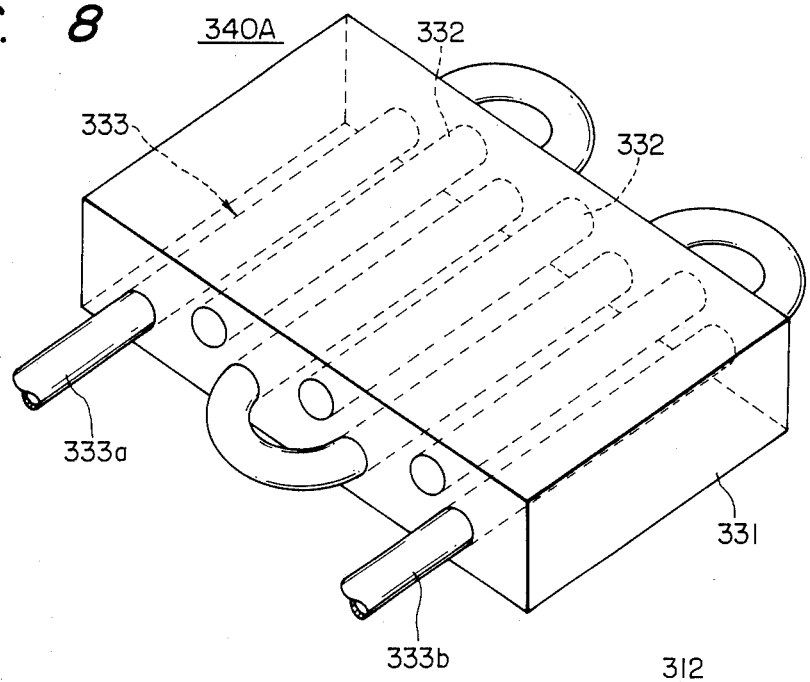
FIG. 8 is a perspective view illustrating a typical IPA heating device suitable for the present invention.
Figure 9:
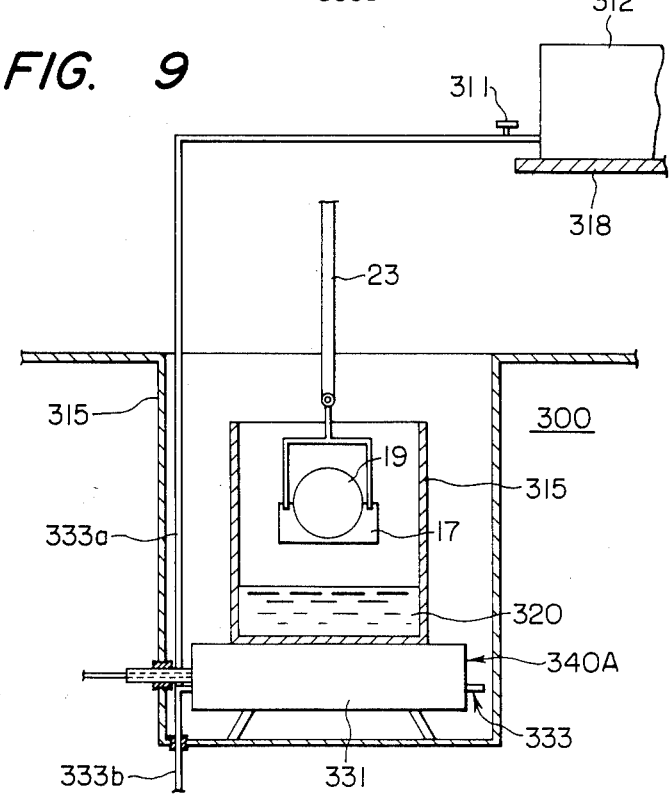
FIG. 9 is a cross section of a vapor cleaning device using the IPA heating means of FIG. 8.

FIG. 8 and FIG. 9 respectively illustrate heating means 340A devised specially to solve the aforementioned problem and the vapor drying part 300 using this heating means.

As illustrated in these diagrams, a main body 331 of the heating means 340A, namely a heater block for heating the IPA 320, is formed of an aluminum block similarly to the heating means of the embodiment of FIG. 6. This main body 331 is provided with a plurality (three in the embodiment of FIG. 8) of holes 332 each in the form of a sheath. Though not shown in FIG. 8, sheathed heaters are inserted one each in these sheathlike holes 332. These sheathed heaters are incorporated in a tightly closed state inside the sheathlike holes 332 by suitable known means lest their heat-generating parts should be exposed to the ambient air.

Inside the main body 331 of the heater block 340A, a water cooling tube 333 is zigzagged substantially parallelly to the sheathlike holes 332 in such a manner as to run halfway in the spaces intervening between the sheathlike holes 332. This water cooling tube 333 is extended in two ways from the heater block 340A. The leading end of one of the extended tubes, 333a, is connected to the cooling water storage tank 312 which is placed on the support base 318. The extended tube is provided near the leading end thereof with a cock 311. The other ended tube 333b of the water cooling tube 333 is connected to a water discharge outlet (not shown). The cock 311 designed for manual operation in the present embodiment permits extension of the flow of the cooling water to the interior of the heater block 340A.

Now, the operation of the present embodiment will be described below.

When the flow of electric current to the sheathed heaters is started, the heater block 340A is heated and the IPA 320 is consequently vaporized. When the wafers 19 cleaned with the aforementioned DI water and supported on the carrier 17 are brought into the vapor of IPA 320 by the movable hanger 23, the wafers 19 are cleaned and dried as described above.

When the power supply is impared as by lightening, for example, while the aforementioned vapor drying treatment is in process, the operator manually opens the cock 311 to start release of the cooling water from the tank 312 into the cooling tube 333 and effect sudden cooling of the heater block 340A. The cooling water which flows out of the tank 12 passes the extended tube 333a enters the heater block 340A, absorbs excess heat in the heater block 340A, flows through the other extended tube 333b and departs from the discharge outlet (not shown). As the result, the heater block 340A is rapidly cooled.

From the foregoing description, it ought to be clear that the embodiment of FIG. 9 can be utilized as protective means when the sensor used in detecting the fact that the vapor of IPA is abnormally diffused outside the quartz container 315 and the concentration of the vapor increases beyond a prescribed level goes out of order. When the abnormal condition mentioned above is recognized visually or some other suitable means, the operator has only to open the cock 311 manually in the same manner as in the case of power failure described above.

It is also clear that the heater block 340A can be utilized effectively for the vapor drying apparatus of FIG. 7 in which the DI water primarily used for cleaning is diverted as cooling water in case of emergency.

As is clear from the foregoing description, the present embodiment brings about the following effects.

(1) Since the means for preventing abnormal generation of the vapor such as of IPA comprises a water cooling tube embedded in a heater block and adapted to permit flow of cooling water therethrough, even when the vapor of IPA is abnormally produced, the disadvantage that steam fills up the interior of the vapor drying apparatus is not suffered to ensue. When the apparatus is desired to resume service, it can be put to use immediately.

(2) Since no cooling water is required under any condition to be poured into the container holding IPA therein, there is absolutely no possibility of IPA becoming unserviceable.

The quartz container used invariably in all the embodiments of this invention described above is produced by fusing five transparent quart plates in the form of five faces of a cube. As the result, diffusion of heat occurs more at the corners of the container than at any other portion of the container. The IPA temperature distribution and, consequently, the vapor concentration distribution within the container, therefore, become uneven. Thus, there are times when the vapor drying of the wafers cannot be obtained thoroughly at the corners of the container. In other words, the conventional rectangular container has the disadvantage that the vapor drying of the wafers is not conducted uniformly.

For the purpose of fully enhancing the effect of vapor drying at the corners thereby precluding the aforementioned disadvantage, the temperature of the heating must be elevated to a level proper at the corners.

The elevation of the heating temperature implies that the concentration of the IPA vapor tends to exceed the allowable limit and the danger of fire or explosion grows when the IPA vapor is not condensed and returned to the quartz container but is diffused in the space inside the apparatus owing to power failure, for example.

Further, since the rectangular container is obtained by fusing five transparent quartz plates as described above, it is deficient in mechanical strength so that particularly the corners thereof have the possibility of readily sustaining damage when they collide against other components or devices. When the container is increased in wall thickness for the purpose of gaining in mechanical strength, it becomes susceptible to fracture by thermal stress. Since the rectangular container is produced by fusing quartz plates as described above, the production thereof consumes so much time as to render mass production and uniformization of quality difficult. Moreover, the produced container itself is expensive.

For the solution of the problem described above, in the embodiment of FIG. 10, the quartz container to be used for the vapor drying of the semiconductor wafer is made of high-purity translucent quartz in the form of a blind tube.

Figure 10:
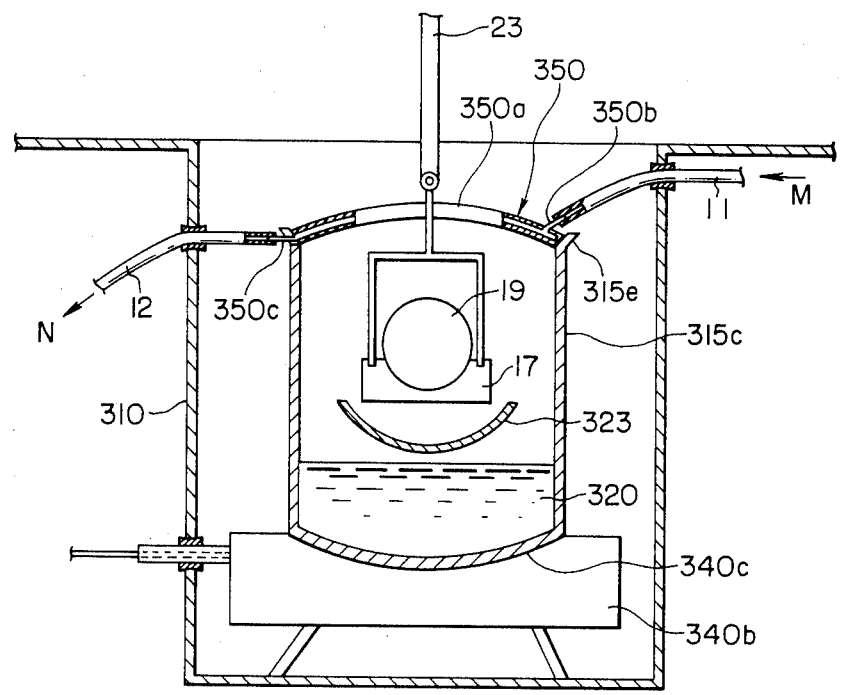
FIG. 10 is a cross section illustrating yet another IPA vapor cleaning device suitable for the present invention.

FIG. 10 is a partial cross section schematically illustrating the construction of a vapor drying part 300 beneficial for the presen invention.

In this diagram, the numerical symbols which have equivalents in FIG. 6 and FIG. 7 denote components of identical or equal structure and function. On the upper side of the aluminum box 340b, a depressed part 340c of a spheroidal quadric (such as sphere or paraboloid). This aluminum box has a heater (not shown) embedded therein in a tightly closed state as laid along the aforementioned depressed part. On this aluminum box 340b is mounted a quartz container 3 in the form of a closed end tube holding IPA 320 therein.

This quartz container 315c is formed of a high-purity translucent quartz. The bottom of this quartz container has a spheroidal quadric intimately matched to the depressed part 340c.

The upper edge of the quartz container 315c is in a tapered shape. A lid 350 shaped in the form of a concave mirror or inverted bowl and provided therein with a cooling water path has its edge in contact with the inner circumferential surface of the tapered edge 315e. As generally accepted, the lid enjoys tightness of closure when this lid and the main body which are brought into mutual contact both have circular faces.

The lid 350 is provided at the center thereof with a perforation 350a so that the carrier 17 supporting thereon the wafers 19 may be placed in and out of the quartz container 315c. The cooling water path laid in the lid 350 is provided with a water feed inlet 350b connected to the water feed tube 11 and a water discharge outlet 350c connected to the water discharge tube 12. As the result, the cooling water fed out of the water feed tube 11 flows through the cooling water path inside the lid 350 as shown by the arrow M and flows out of the water discharge tube 12 as shown by the arrow N.

In the present embodiment, since the quartz container 315c is formed of high-purity translucent quartz in the form of a blind tube, this embodiment does not experience the ununiform vapor drying of the wafers which is inevitably entrailed by the embodiment using a rectangular container. This is because the quartz container 315c in the form of a closed end tube, unlike the conventional rectangular container, has no corner and, therefore, cannot entail the ununiform IPA temperature distribution or vapor concentration distribution due to thermal diffusion in corners.

Further as is evident from the foregoing description, the temperature of the heater during the operation of the apparatus can be controlled to a level (closer to the point 82.7° C.) lower than the conventional rectangular container because the thermal conduction from the aluminum box 340b to the IPA held inside the container 315c is uniformized. As the result, the rate at which the concentration of the IPA vapor increases such as during power failure can be mitigated. In the embodiment of FIG. 10, for example, the safety of the vapor drying apparatus can be heightened as compared with the conventional countertype because the highest heater temperature is lower than the conventional rectangular container.

Further in the present embodiment, the vaporized IPA is cooled and liquefied by the cooling water flowing inside the lid 350 and then returned into the quartz container 315c. Optionally, in the place of the aforementioned lid 350, the cooling pipe devised as described above with respect to the other embodiment may be disposed in the upper inner part of the container.

Figure 11:
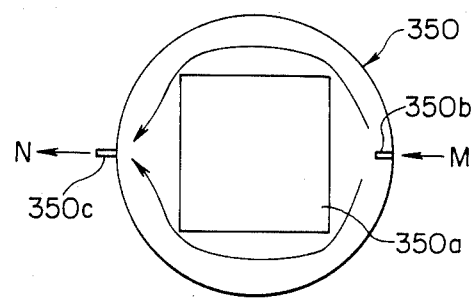
FIG. 11 is a plan view of a lid for the IPA container illustrated in FIG. 10.

The quartz container formed of high-purity translucent quartz in the form of a blind tube as illustrated in FIG. 10 and FIG. 11 can be integrally molded in the same way as a high-purity opaque crucible is produced for use in the production of a bar of single crystal semiconductor. As the result, the production of this quartz container permits a generous saving in time as compared with the production of the conventional rectangular container which inevitably entails fusion of quartz plates. Besides being inexpensive, the present container enjoys the advantage that it is integrally molded and, therefore, possesses high mechanical strength. Further, since the high-purity translucent quartz contains numerous bubbles therein, the container made of this quartz minimally develops thermal stress even in the presence of temperature difference and, therefore, does not easily sustain fracture due to thermal stress.

In the vapor drying apparatus constructed as described above, the vaporized IPA is virtually wholly condensed and returned into the quartz container owing to the cooling water flowing through the cooling pipe disposed in the upper inner part of the quartz container or through the perforation in the lid of the container. It is, however, difficult for the vaporized IPA to be thoroughly liquefied and returned into the quartz container. Thus, the portion of the IPA vapor which escapes being condensed and returned to the quartz container inevitably diffuses upwardly outside the quartz container and eventually floats in the space inside the vapor drying apparatus.

The flotation of the IPA vapor in the space inside the vapor drying apparatus exposes the apparatus to the danger of fire or explosion and proves undesirable for the safety of the apparatus. It also entails the possibility that the organic substances entrained by IPA will adhere to the wafer which has already been cleaned.

Figure 12:
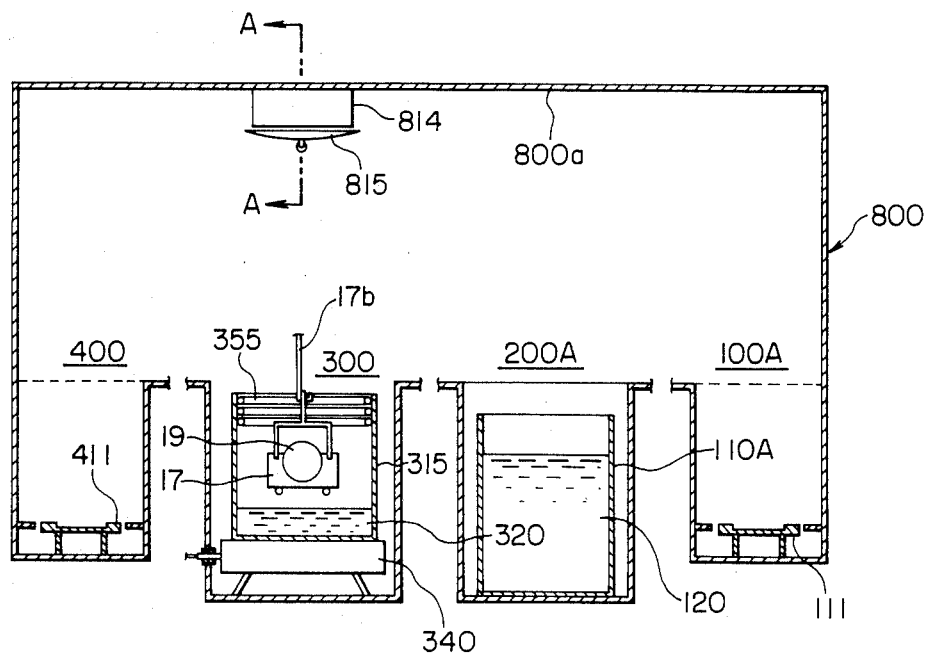
FIG. 12 is a schematic cross section of the vapor drying apparatus of this invention additionally incorporating therein means for collection of IPA vapor.

FIG. 12 is a partial cross section illustrating another embodiment of this invention, wherein means capable of cooling and liquefying the floating volatile cleaning liquid is disposed at a prescribed place inside the vapor drying apparatus.

In the embodiment of FIG. 12, since the wafer charging part 100A, the water washing part 200A, the vapor drying part 300, and the wafer discharge part 400 are equal to the components bearing the same numerical symbols as in the embodiments so far described, this embodiment is depicted in an extremely simplified pattern. As a sole exception, a cooling pipe 355 which has not been illustrated with respect to any of the preceding embodiments is shown as disposed in the upper inner part of the quartz container 315.

In the present embodiment, an element 814 (such as, for example, a Peltier element) capable of cooling and liquefying the vaporized IPA is disposed on the ceiling part 800a of the partition panel 800 of the vapor drying apparatus, i.e. at the position above the vapor drying part 300. A receptacle plate 815 for collecting the liquefied IPA is disposed directly below the aforementioned Peltier element.

Figure 13:
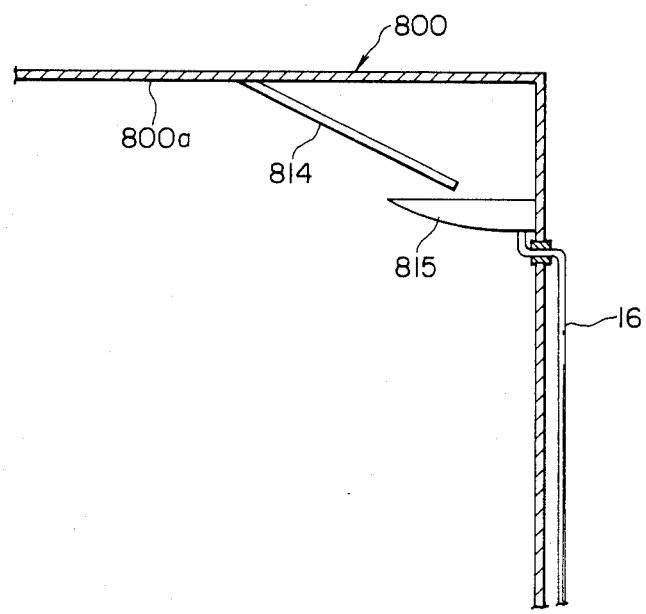
FIG. 13 is a cross section taken through FIG. 12 along the line A—A.

FIG. 13 is a partially sectioned side view taken through FIG. 12 along the line A—A for the purpose of illustrating clearly the manner in which the Peltier element 814 and the receptacle plate 815 are attached to the inner surface of the partition member 800.

The IPA which is collected in the receptacle plate 815 is discharged out of the vapor drying apparatus through the discharge tube 16.

While the operation of the vapor drying apparatus is in process, the vaporized IPA floats in the space inside the vapor drying apparatus, particularly in the upper portion of the vapor drying part 300. When the floating IPA is brought into contact with the cool contact of the Peltier element 814 and consequently cooled, it is condensed into liquid drops. When the liquid drops collect and growth to a certain size, the grown beads flow down the surface of the Peltier element 814 and fall off the lower leading end of the Peltier element into the receptacle plate 815. The liquid IPA so collected in the receptacle plate 815 is discharged out of the vapor drying apparatus via the liquid discharge tube 16.

In the embodiment of FIG. 12, since the vapor density of the volatile cleaning liquid floating in the space inside the vapor drying apparatus can be suppressed to a low level, the safety of the vapor drying apparatus is enhanced and the cleanliness of the atmosphere inside the aforementioned apparatus is improved. As the result, harmful unwanted volatile cleaning liquid and other organic substances are not suffered to adhere to the wafer surface between the time the wafer undergoes the vapor drying treatment and the time the wafer is taken out of the vapor drying apparatus. Thus, the wafer can be taken out in a nearly ideally cleaned and dried state.

What is claimed is:
1. A vapor drying apparatus comprising
   a cleaning section including a first container storing therein a cleaning liquid for cleaning a given object,
   a vapor drying section including a second container storing therein a volatile cleaning liquid and means for heating and vaporizing said volatile cleaning liquid and adapted to expose to the vapor of said volatile cleaning liquid said given object which has been cleaned in said cleaning section and thereby effect vapor drying of said given object, partition means for airtightly isolating said cleaning section and vapor drying section from the ambient atmosphere and defining a space for vapor drying, means for selectively inserting said given object through said partition means into said space for vapor drying and taking said given object out of said space without admitting ambient atmosphere into said space, and carrier means for transferring said given object to desired positions inside said space for vapor drying without exposing the given part to ambient atmosphere.

2. A vapor dryng apparatus comprising a cleaning part including a first container storing therein a cleaning liquid for cleaning a given object, a vapor drying part including a second container storing therein a volatile cleaning liquid and means for heating and vaporizing said volatile cleaning liquid and adapted to expose to the vapor of said volatile cleaning liquid said given object which has been cleaned in said cleaning part and thereby effect vapor drying of said given object, a partition member for airtightly isolating said cleaning part and vapor drying part from the ambient atmosphere and defining a space for vapor drying, means for selectively inserting said given object through said partition member into said space for vapor drying and taking said given object out of said space, and carrier means for transferring said given object to desired positions inside said space for vapor drying, which vapor drying apparatus is provided with means for heating said given object which has been cleaned and rapidly removing said vaporized cleaning liquid adhering to surfaces of said given object between the time said cleaned object has been subjected to vapor drying treatment and the time said object is taken out of said apparatus.

3. A vapor drying apparatus comprising a cleaning section including a first container storing therein a cleaning liquid for cleaning a given object, a vapor drying section including a second container storing therein a volatile cleaning liquid and means for heating and vaporizing said volatile cleaning liquid and adapted to expose to the vapor of said volatile cleaning liquid said given object which has been cleaned in said cleaning section and thereby effect vapor drying of said given object, a partition member for airtightly isolating said cleaning section and vapor drying section from the ambient atmosphere and defining a space for vapor drying, means for selectively inserting said given object through said partition member into said space for vapor drying and taking said given object out of said space, and carrier means for transferring said given object to desired positions inside said space for vapor drying, wherein, said means for selectively inserting a said given object into said space for vapor drying and taking said given object out of said space through said partition member is a pass-through room adapted to selectively communicate with said space for vapor drying through an inner door and with said ambient atmosphere through an outer door, and said pass-through room is provided with carrier supporting means disposed inside said inner door so as to hold said carrier supporting thereon said given object, at least one gas feed duct for feeding a predetermined gas into said pass-through room, a gas discharge duct for discharging said gas out of said pass-through room, and means for alternately opening or closing said inner door and said outer door to permit passage of said carrier.

4. A vapor drying apparatus according to claim 3, wherein said predetermined gas is $N_2$ gas.

5. A vapor drying apparatus according to claim 3, wherein said carrier supporting means is provided with perforations through which th egas inside said pass-through room is exhausted and discharged.

6. A vapor drying apparatus according to claim 3, which is provided with a second gas feed duct for feeding an oxygen-containing gas in addition to said gas feed duct and means for irradiating said object supported on said carrier held on said supporting means with far ultraviolet light.

7. A vapor driving apparatus comprising a cleaning part including a first container storing therein a cleaning liquid for cleaning a given object, a vapor drying part including a second container storing therein a volatile cleaning liquid and means for heating and vaporizing said volatile cleaning liquid and adapted to expose to the vapor of said volatile cleaning liquid said given object which has been cleaned in said cleaning part and thereby effect vapor drying of said given object, a partition member for airtightly isolating said cleaning part and vapor drying part from the ambient atmosphere and defining a space for vapor drying, means for selectively inserting said given object through said partition member into said space for vapor drying and taking said given object out of said space, and carrier means for transferring said given object to desired positions inside said space for vapor drying, wherein, said second container is supported on said heating means and is provided with a cooling water tank retained at a position higher than the surface of said volatile cleaning liquid, a water discharge tube for leading said cooling water from said tank to at least one of said second container and said heating means and releasing it therefrom, and a cock disposed halfway in said discharge tube and adapted to control said release of water.

8. A vapor drying apparatus according to claim 7, wherein said water is deionized water.

9. A vapor drying apparatus according to claim 7, wherein said heating means is a heater block having a heater incorporated therein in a tightly closed state, said heater block has a water cooling tube embedded therein, and said cooling water tube is connected to said water discharge tube.

10. A vapor drying apparatus comprising a cleaning part including a first container storing therein a cleaning liquid for cleaning a given object, a vapor drying part including a second container storing therein a volatile cleaning liquid and means for heating and vaporizing said volatile cleaning liquid and adapted to expose to the vapor of said volatile cleaning liquid said given object which has been cleaned in said cleaning part and thereby effect vapor drying of said given object, a partition member for airtightly isolating said cleaning part and vapor drying part from the ambient atmosphere and defining a space for vapor drying, means for selectively inserting said given object through said partition member into said space for vapor drying and/or taking said given object out of said space, and carrier means for transferring said given object to desired positions inside said space for vapor drying, which vapor drying apparatus is further provided with cooling and liquefying means for enabling a gas of the volatile cleaning liquid diffused from said second container into said space for vapor drying to be cooled and liquefied inside said space for vapor drying.

11. A vapor drying apparatus according to claim 10, wherein said cooling and liquefying means is a Peltier element.

12. The vapor drying apparatus of claim 1 wherein said partition member has a lower leading end immersed in said cleaning liquid to partition said first container into an inner side and an outer side, said apparatus being provided with a transfer base having a bottom plate, said carrier means being mounted on said bottom plate, said given object being moveable with said carrier means from the outer side to the inner side of said first container, while held in a state below the surface of said cleaning liquid, and wherein said carrier means has an arm member protruding upwardly from the surface of said cleaning liquid when the carrier means is immersed in said cleaning liquid.

13. A vapor drying apparatus according to claim 12, which further comprises an opening formed in the lower leading end part of said partition member so as to permit said arm member to pass through said partition member when said transfer base is moved from the outer side to the inner side of said container and means for closing said opening when said transfer base has been moved to a prescribed position on the inner side of said container.

14. A vapor drying apparatus according to claim 13, wherein said opening is an indentation formed in the lower portion of said partition member and means for closing said opening is a plate member formed integrally with said transfer base and protruding upwardly from the surface of said cleaning liquid so as to close said indentation.

15. The vapor drying apparatus of claim 1, and means for heating said given object which has been cleaned, and rapidly removing vaporized cleaning liquid adhering to surfaces of said given object prior to the time that the object is removed from the apparatus.

16. The vapor drying apparatus of claim 1 wherein said means for selectively inserting comprises a pass-through room adapted to selectively communicate with said space for vapor drying through an inner door and with said ambient atmosphere through an outer door, said pass-through room being provided with carrier supporting means inside the inner door as to hold a carrier having a given object thereon, and gas duct means for feeding a predetermined gas into said pass-through room and for discharging said gas out of said pass-through room.

17. The vapor drying apparatus of claim 1, wherein said second container is supported on said heating means and is provided with a cooling water tank retained at a position higher than the surface of said volatile cleaning liquid, and water discharge control means for controlling removal of cooling water from the cooling water tank and adding cooling water 20 to said second container.

18. The vapor drying apparatus of claim 1, wherein said heating means comprises a block member having a recess in the form of a spheroidal quadric formed on the upper side thereof, and wherein said second container is formed of quartz in the form of a closed end tube that has a bottom part formed to fit tightly against said recess.

19. The apparatus as specified in claim 1, wherein said vapor drying apparatus has cooling and liquifying means associated therewith for cooling and liquifying gases of the volatile cleaning liquid that defuse from said second container into said vapor drying space.

20. Apparatus according to claim 1 wherein said partition means includes at least one pass-through room having a first door openable between the pass-through room and said space for vapor drying and a second door openable between the pass-through room and the ambient atmosphere, the first door being opened to admit the given object and closed thereafter before the second door is opened.

21. Apparatus according to claim 20 including further means for flushing said pass-through room of any ambient atmosphere before opening said first door.

22. Apparatus according to claim 21 wherein said further means includes first duct means for feeding a predetermined gas into said pass-through room and second duct means for discharging the predetermined gas from said pass-through room.

23. A vapor drying apparatus comprising:

a cleaning section including a first container storing therein a cleaning liquid for cleaning a given object, a vapor drying section including a second container storing therein a volatile cleaning liquid and means for heating and vaporizing said volatile cleaning liquid and adapted to expose to the vapor of said volatile cleaning liquid said given object which has been cleaned in said cleaning section and thereby effect vapor drying of said given object, a partition member for airtightly isolating said cleaning section and vapor drying section from the ambient atmosphere and defining a space for vapor drying, means for selectively inserting said given object thrugh said partition member into said space for vapor drying and taking said given object out of said space, carrier means for transferring said given object to desired positions inside siad space for vapor drying without exposing the given part to ambient atmosphere, and means for irradiating said object which has been cleaned with ultraviolet light between the time said cleaned object has been subject to vapor drying treatment and the time said object is taken out of said apparatus.

* * * * *

UNITED STATES PATENT AND TRADEMARK OFFICE
CERTIFICATE OF CORRECTION

PATENT NO. : 4,736,758
DATED : April 12, 1988
INVENTOR(S) : Masaki Kusuhara

It is certified that error appears in the above-identified patent and that said Letters Patent is hereby corrected as shown below:

Column 20, line 64, delete "volatible" and insert --volatile--.

Column 21, line 64, after "inserting", delete "a".

Column 22, line 16, after "which", delete "th egas" and insert --the gas--.

Column 23, line 8, delete "and/or" and insert --and--; line 15, delete "drving" and insert --drying--.

Column 24, line 57, delete "siad" and insert --said--.

Signed and Sealed this

Fourth Day of October, 1988

Attest:

DONALD J. QUIGG

Attesting Officer

Commissioner of Patents and Trademarks